United States Patent
Sayama

(10) Patent No.: US 8,269,568 B2
(45) Date of Patent: Sep. 18, 2012

(54) METHOD FOR MANUFACTURING PIEZOELECTRIC VIBRATOR, PIEZOELECTRIC VIBRATOR, AND OSCILLATOR

(75) Inventor: Kiyotaka Sayama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 251 days.

(21) Appl. No.: 12/701,040

(22) Filed: Feb. 5, 2010

(65) Prior Publication Data
US 2010/0207697 A1    Aug. 19, 2010

(30) Foreign Application Priority Data
Feb. 13, 2009    (JP) ................................. 2009-031619

(51) Int. Cl.
*H03B 5/30*    (2006.01)

(52) U.S. Cl. ...................... 331/158; 331/107 R; 331/154
(58) Field of Classification Search .................. 331/158, 331/107 R, 116 R, 154
See application file for complete search history.

(56) References Cited

U.S. PATENT DOCUMENTS

| | | | |
|---|---|---|---|
| 5,925,502 A | 7/1999 | Vig et al. | |
| 2004/0070462 A1 | 4/2004 | Alhayek et al. | |
| 2008/0179997 A1* | 7/2008 | Ichikawa | 310/370 |

FOREIGN PATENT DOCUMENTS

| | | |
|---|---|---|
| JP | 07-176971 A | 7/1995 |
| JP | 2000-124755 A | 4/2000 |
| JP | 2006-101244 A | 4/2006 |
| JP | 2007-096899 A | 4/2007 |

OTHER PUBLICATIONS

Extended European Search Report for European Application No. 10153369.3, dated Jul. 15, 2011, 8 pages.

* cited by examiner

*Primary Examiner* — Joseph Chang
*Assistant Examiner* — Jeffrey Shin
(74) *Attorney, Agent, or Firm* — Brinks Hofer Gilson & Lione

(57) ABSTRACT

The invention provides a method for manufacturing a piezoelectric vibrator, a piezoelectric vibrator, and an oscillator, whereby mounting of the piezoelectric vibrating piece by flip-chip bonding is ensured. A manufacturing method of a piezoelectric vibrator is a method for manufacturing a piezoelectric vibrator that includes: a base substrate; a lid substrate bonded to the base substrate; a piezoelectric vibrating piece including a crystal plate having on its outer surface excitation electrodes, and mount electrodes electrically connected to the excitation electrodes; inner electrodes to be electrically connected to the piezoelectric vibrating piece; and metal bumps to provide electrical interconnections between the inner electrodes and the mount electrodes. The method includes a inner electrodes forming step of forming the inner electrodes, a metal bump forming step of forming the metal bumps, and a mount step of bonding the mount electrodes of the piezoelectric vibrating piece to the metal bumps, wherein, in the mount step, the piezoelectric vibrating piece is mounted and fixed in such a manner that tips of the metal bumps are not in contact with the crystal plate.

9 Claims, 10 Drawing Sheets

METHOD FOR MANUFACTURING PIEZOELECTRIC VIBRATOR, PIEZOELECTRIC VIBRATOR, AND OSCILLATOR

RELATED APPLICATIONS

This application claims priority under 35 U.S.C. §119 to Japanese Patent Application No. 2009-031619 filed on Feb. 13, 2009, the entire content of which is hereby incorporated by reference.

FIELD OF THE INVENTION

The present invention relates to a method for manufacturing a piezoelectric vibrator, a piezoelectric vibrator, and an oscillator.

BACKGROUND ART

A piezoelectric vibrator has been widely used that includes a base substrate and a lid substrate, both made of glass, anodically bonded in layers with a cavity formed therebetween, and a piezoelectric vibrating piece mounted on the base substrate in a portion inside the cavity. The piezoelectric vibrator of this type has been used for applications such as a clock source, a timing source of control signals or the like, and a reference signal source by being installed in, for example, cellular phones and personal digital assistant units.

In conventional piezoelectric vibrators, the piezoelectric vibrating piece is mounted by connecting and fixing the mount electrodes of the piezoelectric vibrating piece to a conductive adhesive applied on the inner electrodes formed on the base substrate (see, for example, JP-A-2000-124755).

Recently, in order to more reliably mount the piezoelectric vibrating piece inside the cavity, a method for mounting the piezoelectric vibrating piece by a technique known as flip-chip bonding has been proposed in which the mount electrodes of the piezoelectric vibrating piece are connected and fixed to the bumps made of, for example, gold, formed on the inner electrodes formed on the base substrate.

SUMMARY OF THE INVENTION

However, the mounting of the piezoelectric vibrating piece by flip-chip bonding may give rise to a problem in that the interconnections between the bumps and the mount electrodes are not properly made, failing to mount the piezoelectric vibrating piece. Specifically, the piezoelectric vibrating piece is not mounted properly when detachment occurs at the bonding portion made by the bonding between the piezoelectric vibrating piece and the bumps, or when there is a reduction in strength due to incomplete film composition of the mount electrodes (electrode film) formed on the piezoelectric vibrating piece.

The present invention has been made under these circumstances, and an object of the present invention is to provide a method for manufacturing a piezoelectric vibrator, a piezoelectric vibrator, and an oscillator, whereby the piezoelectric vibrating piece can be reliably mounted using flip-chip bonding.

In order to solve the foregoing problem, the present invention provides the following.

A manufacturing method of a piezoelectric vibrator according to the present invention is a method for manufacturing a piezoelectric vibrator that includes: a base substrate; a lid substrate bonded to the base substrate in an opposing configuration; a piezoelectric vibrating piece housed in a cavity formed between the base substrate and the lid substrate, bonded on an upper surface of the base substrate, and including a crystal plate having on its outer surface excitation electrodes and mount electrodes electrically connected to the excitation electrodes; inner electrodes formed on the upper surface of the base substrate to be electrically connected to the piezoelectric vibrating piece; and metal bumps formed at predetermined positions of the inner electrodes to provide electrical interconnections between the inner electrodes and the mount electrodes, the piezoelectric vibrating piece being mounted on the metal bumps in a cantilever fashion. The method includes a inner electrodes forming step of forming the inner electrodes on the upper surface of the base substrate; a metal bump forming step of forming the metal bumps at predetermined positions of the inner electrodes; and a mount step of bonding the mount electrodes of the piezoelectric vibrating piece to the metal bumps, wherein, in the mount step, the piezoelectric vibrating piece is mounted and fixed in such a manner that tips of the metal bumps are not in contact with the crystal plate.

With this configuration, the possible detachment from the bonding portion that may occur when the tips of the metal bumps are in contact with the crystal plate can be prevented. More specifically, because the piezoelectric vibrating piece is mounted and fixed in such a manner that the tips of the metal bumps are positioned halfway in the mount electrodes, the bond strength between the metal bumps and the mount electrodes can be increased. This ensures the mounting of the piezoelectric vibrating piece by flip-chip bonding.

A manufacturing method of a piezoelectric vibrator according to the present invention includes the step of etching the crystal plate prior to forming the mount electrodes on the crystal plate.

With this configuration, the surface irregularities of the crystal plate can be removed, and therefore the bonding area for the mount electrodes formed on the surface of the crystal plate can be increased. This improves the adhesion between the crystal plate and the mount electrodes.

A manufacturing method of a piezoelectric vibrator according to the present invention includes the step of forming an underlying film made of conductive material in regions of the crystal plate where the mount electrodes are formed, wherein the mount electrodes are formed after forming the underlying film, and wherein, in the mount step, the piezoelectric vibrating piece is mounted and fixed in such a manner that the tips of the metal bumps are positioned halfway in the mount electrodes and do not reach the interface between the mount electrodes and the underlying film.

By the provision of the underlying film made of conductive material on the surface of the crystal plate, the adhesion between the crystal plate and the mount electrodes can be improved. Further, because the piezoelectric vibrating piece is mounted and fixed in such a manner that the tips of the metal bumps are positioned halfway in the mount electrodes, the bond strength between the metal bumps and the mount electrodes can be increased. This ensures the mounting of the piezoelectric vibrating piece by flip-chip bonding.

A manufacturing method of a piezoelectric vibrator according to the present invention uses chromium for the underlying film.

By using chromium as the underlying film, the adhesion between the crystal plate and the mount electrodes can be further improved.

In a manufacturing method of a piezoelectric vibrator according to the present invention, the metal bumps and the mount electrodes are both made of gold.

With this configuration, the bond strength between the metal bumps and the mount electrodes can be further increased.

A piezoelectric vibrator according to the present invention includes: a base substrate; a lid substrate bonded to the base substrate in an opposing configuration; a piezoelectric vibrating piece housed in a cavity formed between the base substrate and the lid substrate, bonded on an upper surface of the base substrate, and including a crystal plate having on its outer surface excitation electrodes and mount electrodes electrically connected to the excitation electrodes; inner electrodes formed on the upper surface of the base substrate to be electrically connected to the piezoelectric vibrating piece; and metal bumps formed at predetermined positions of the inner electrodes to provide electrical interconnections between the inner electrodes and the mount electrodes, the piezoelectric vibrating piece being mounted on the metal bumps in a cantilever fashion, wherein the piezoelectric vibrating piece is mounted and fixed in such a manner that the tips of the metal bumps are not in contact with the crystal plate.

With this configuration, the possible detachment from the bonding portion that may occur when the tips of the metal bumps are in contact with the crystal plate can be prevented. More specifically, because the piezoelectric vibrating piece is mounted and fixed in such a manner that the tips of the metal bumps are positioned halfway in the mount electrodes, the bond strength between the metal bumps and the mount electrodes can be increased. This ensures the mounting of the piezoelectric vibrating piece by flip-chip bonding.

A piezoelectric vibrator according to the present invention includes an underlying film made of conductive material between the crystal plate and the mount electrodes.

By the provision of the underlying film made of conductive material on the surface of the crystal plate, the adhesion between the crystal plate and the mount electrodes can be improved. This ensures the mounting of the piezoelectric vibrating piece by flip-chip bonding.

In a piezoelectric vibrator according to the present invention, the underlying film is formed of chromium.

By using chromium as the underlying film, the adhesion between the crystal plate and the mount electrodes can be further improved.

In an oscillator according to the present invention, the piezoelectric vibrator described above is electrically connected as a resonator to an integrated circuit.

Because an oscillator according to the present invention uses the piezoelectric vibrator in which the mounting of the piezoelectric vibrating piece by flip-chip bonding is ensured, an oscillator with a stable product quality can be provided.

With a manufacturing method of a piezoelectric vibrator according to the present invention, the possible detachment from the bonding portion that may occur when the tips of the metal bumps are in contact with the crystal plate can be prevented. More specifically, because the piezoelectric vibrating piece is mounted and fixed in such a manner that the tips of the metal bumps are positioned halfway in the mount electrodes, the bond strength between the metal bumps and the mount electrodes can be increased. This ensures the mounting of the piezoelectric vibrating piece by flip-chip bonding.

DETAILED DESCRIPTION OF THE PREFERRED EMBODIMENTS

Figure 1:
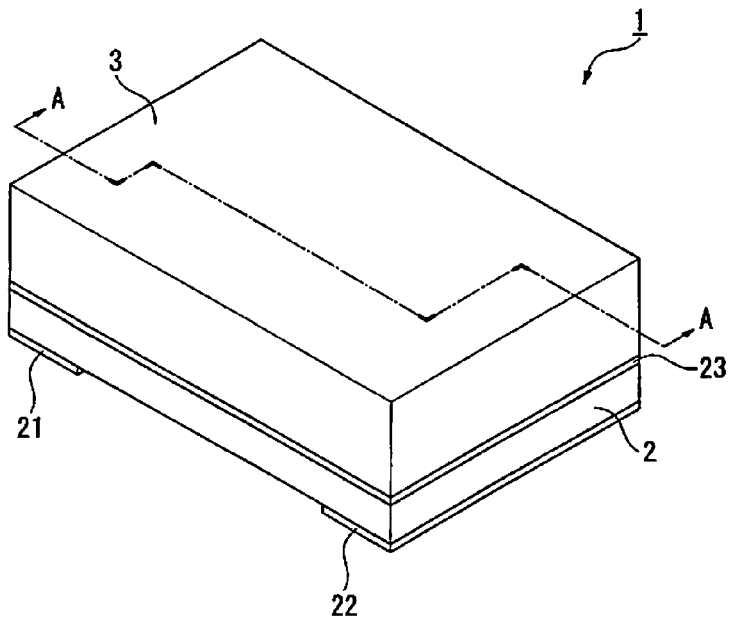
FIG. 1 is an external perspective view of a piezoelectric vibrator of an embodiment of the present invention.

An embodiment of the present invention is described below with reference to FIG. 1 to FIG. 12.

As illustrated in FIG. 1 to FIG. 4, a piezoelectric vibrator 1 is a surface-mounted piezoelectric vibrator including a base substrate 2 and a lid substrate 3 stacked together in two layers in the form of a box, and a piezoelectric vibrating piece 4 housed in a cavity 16 formed inside the vibrator.

Figure 4:
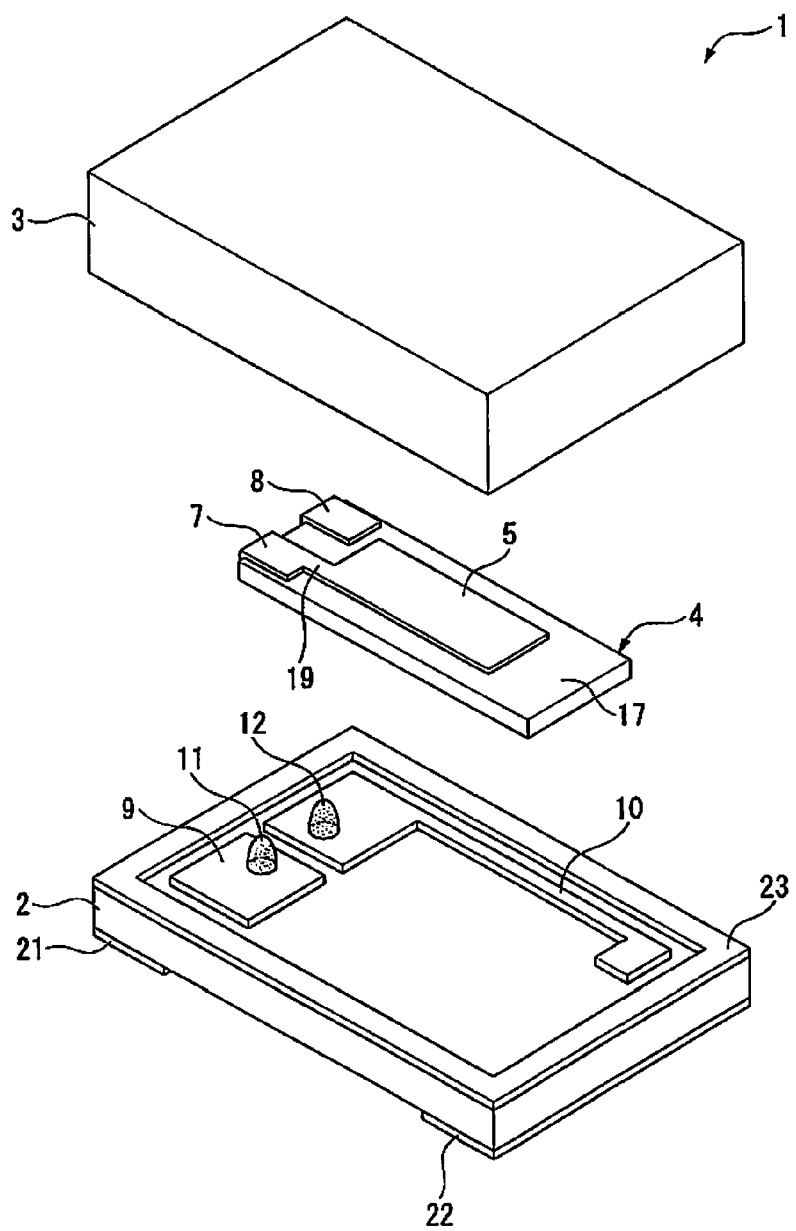
FIG. 4 is an exploded perspective view of a piezoelectric vibrator of an embodiment of the present invention.

In FIG. 4, through electrodes 13 and 14, and through holes 24 and 25, described later, are not illustrated for ease of illustration.

The piezoelectric vibrating piece 4 is an AT-cut vibrating piece formed from a crystal of piezoelectric material, and vibrates in response to an applied predetermined voltage.

The piezoelectric vibrating piece 4 includes a crystal plate 17 substantially rectangular in shape in a planar view and having a uniform thickness, a pair of excitation electrodes 5 and 6 disposed on the opposing faces of the crystal plate 17, extraction electrodes 19 and 20 electrically connected to the excitation electrodes 5 and 6, and mount electrodes 7 and 8 electrically connected to the extraction electrodes 19 and 20. The mount electrode 7 is electrically connected to a side electrode 15 of the crystal plate 17 so as to be electrically connected to the mount electrode 7 formed on the side of the crystal plate 17 where the excitation electrode 6 is provided.

The excitation electrodes 5 and 6, the extraction electrodes 19 and 20, the mount electrodes 7 and 8, and the side electrode 15 are formed of, for example, a gold (Au) coating. These films may be formed as conductive film coatings of, for example, chromium (Cr), nickel (Ni), aluminum (Al), or titanium (Ti), or as laminated films of such conductive films.

The piezoelectric vibrating piece 4 structured as above is bump bonded on an upper surface of the base substrate 2 using bumps 11 and 12 made of gold. Specifically, the piezoelectric vibrating piece 4 is bump bonded with the mount electrodes 7 and 8 respectively in contact with the bumps 11 and 12 respectively formed on inner electrodes 9 and 10 (described later) patterned on the upper surface of the base substrate 2. In this way, the piezoelectric vibrating piece 4 is supported by being suspended above the base substrate 2 with the distance corresponding to the thickness of the bumps 11 and 12, with the mount electrodes 7 and 8 and the inner electrodes 9 and 10 being electrically connected to each other, respectively.

The bumps 11 and 12 and the mount electrodes 7 and 8 are bonded together as follows.

Figure 5:
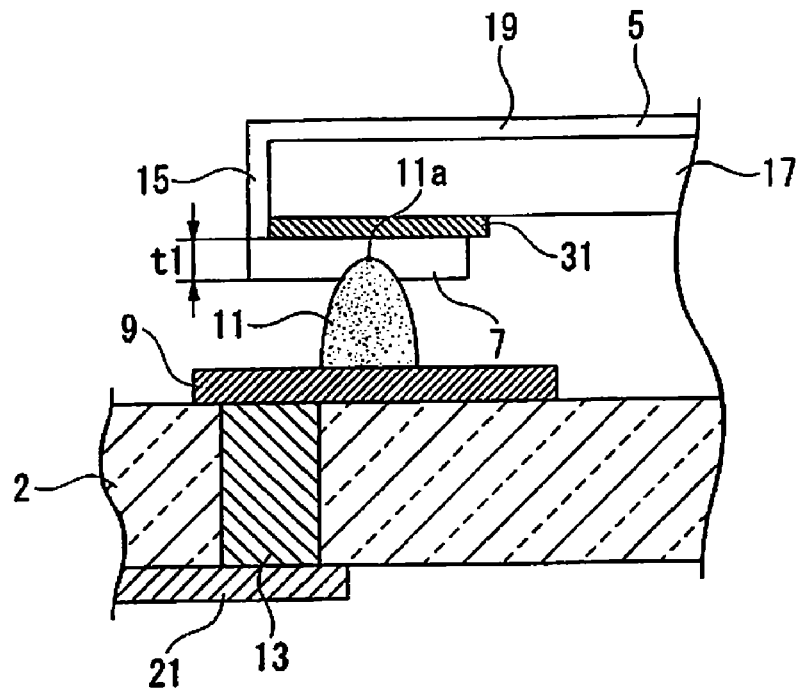
FIG. 5 is a partially enlarged view of a bonded portion of the piezoelectric vibrating piece and the bumps in an embodiment of the present invention.
Figure 5:
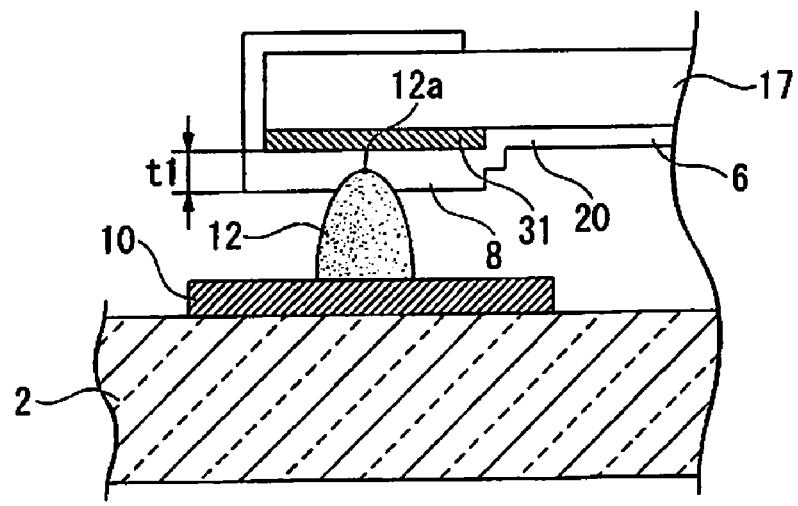

As illustrated in FIG. 5, an underlying film 31 made of chromium is formed in regions of the crystal plate 17 where the mount electrodes 7 and 8 are formed. The mount electrodes 7 and 8 are formed on the underlying film 31. The mount electrodes 7 and 8 have thickness t1 thicker than the extraction electrodes 19 and 20, the excitation electrodes 5 and 6, and the side electrode 15.

At the point of bonding between the mount electrodes 7 and 8 and the bumps 11 and 12, the piezoelectric vibrating piece 4 is mounted and fixed in such a manner that tips 11a and 12a of the bumps 11 and 12 are positioned halfway in the mount electrodes 7 and 8. In other words, the tips 11a and 12a of the bumps 11 and 12 are not in contact with the underlying film 31.

Referring back to FIG. 1 to FIG. 4, the lid substrate 3 is a substrate made of a glass material, for example, soda-lime glass. On the side of the surface bonded to the base substrate 2 is provided a rectangular depression (cavity) 16 where the piezoelectric vibrating piece 4 is housed. The depression 16 is formed to provide a cavity when the base substrate 2 and the lid substrate 3 are mated, thus providing the cavity 16 for housing the piezoelectric vibrating piece 4. The lid substrate 3 is anodically bonded to the base substrate 2 with the depression 16 facing the base substrate 2.

The base substrate 2 is a substrate made of a glass material, for example, soda-lime glass. The base substrate 2 is substantially planar in shape, and sized to be mated with the lid substrate 3.

The base substrate 2 includes a pair of through holes 24 and 25 formed through the base substrate 2. One end of the through holes 24 and 25 opens into the cavity 16. Specifically, the one through hole 24 is provided on the side of the mount electrodes 7 and 8 of the piezoelectric vibrating piece 4 mounted in position, and the other through hole 25 is provided on the opposite side from the mount electrodes 7 and 8 of the piezoelectric vibrating piece 4. Further, the through holes 24 and 25 are provided through the base substrate 2 substantially cylindrically, parallel to the thickness direction of the base substrate 2. The through holes 24 and 25 may be tapered to gradually increase or decrease their diameters towards the lower surface of the base substrate 2, for example.

In the through holes 24 and 25, a pair of through electrodes 13 and 14 is provided, plugging the through holes 24 and 25. The through electrodes 13 and 14 are provided to close the through holes 24 and 25 and thereby maintain the cavity 16 air-tight, and to provide conduction between external electrodes 21 and 22 (described later) and the inner electrodes 9 and 10, respectively. The gaps between the through holes 24 and 25 and the through electrodes 13 and 14 are completely closed with a glass frit material (not shown) having substantially the same coefficient of thermal expansion as the glass material used for the base substrate 2.

The upper surface side (the side bonded to the lid substrate 3) of the base substrate 2 are patterned with a bonding film 23 for anodic bonding, and the inner electrodes 9 and 10, using a conductive material (for example, such as aluminum and silicon). The bonding film 23 is formed along the periphery of the base substrate 2, surrounding the depression 16 formed in the lid substrate 3.

The inner electrodes 9 and 10 are patterned to provide electrical interconnections between the one through electrode 13 and the one mount electrode 7 of the piezoelectric vibrating piece 4, and between the other through electrode 14 and the other mount electrode 8 of the piezoelectric vibrating piece 4. Specifically, the one inner electrode 9 is formed directly above the one through electrode 13 on the side of the mount electrodes 7 and 8 of the piezoelectric vibrating piece 4. The other inner electrode, the inner electrode 10, is formed directly above the other through electrode 14 by being routed along the piezoelectric vibrating piece 4 from the position adjacent to the one inner electrode 9 to the side opposite from the through electrode 13 appearing on the base substrate 2.

The bumps 11 and 12 are formed on the inner electrodes 9 and 10, and the piezoelectric vibrating piece 4 is mounted using the bumps 11 and 12. This provides conduction between the one mount electrode 7 of the piezoelectric vibrating piece 4 and one the through electrode 13 via the one inner electrode 9, and between the other mount electrode 8 and the other through electrode 14 via the other inner electrode 10.

On the lower surface of the base substrate 2 are provided external electrodes 21 and 22 electrically connected to the through electrodes 13 and 14, respectively. Specifically, one of the external electrodes, the external electrode 21, is electrically connected to the first excitation electrode, 5, of the piezoelectric vibrating piece 4 via the one through electrode 13 and the one inner electrode 9. The other external electrode, the external electrode 22, is electrically connected to the second excitation electrode, 6, of the piezoelectric vibrating piece 4 via the other through electrode 14 and the other inner electrode 10.

The piezoelectric vibrator 1 structured as above is activated by applying a predetermined drive voltage to the external electrodes 21 and 22 formed on the base substrate 2. In response, current flows through the first and second excitation electrodes 5 and 6 of the piezoelectric vibrating piece 4, causing vibration at a predetermined frequency. The vibration can then be used as the timing source of control signals, or the reference signal source.

Figure 6:
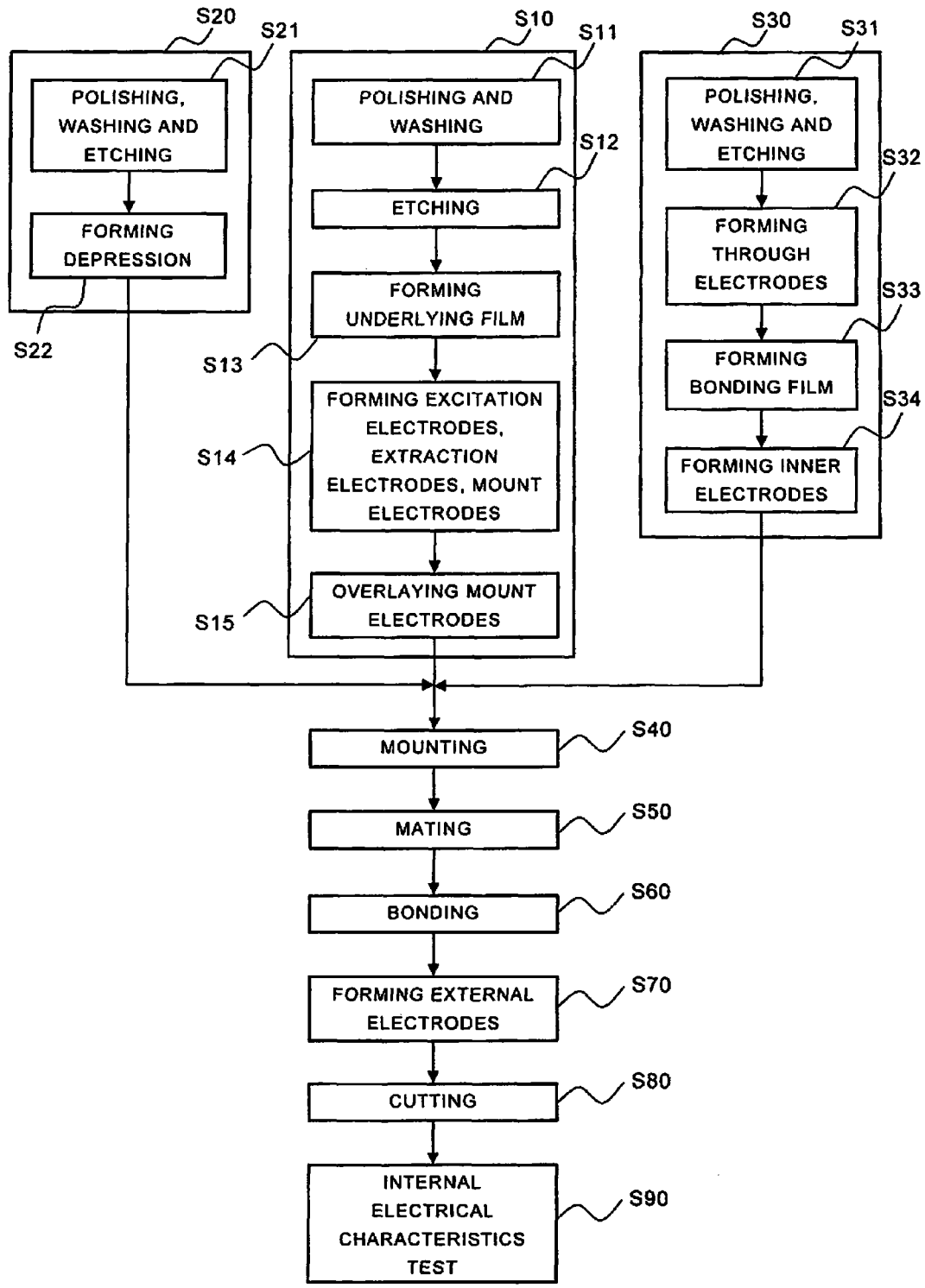
FIG. 6 is a flow chart representing a flow of the manufacture of a piezoelectric vibrator of an embodiment of the present invention.

The following describes a method for manufacturing a plurality of piezoelectric vibrators 1 at once using a base substrate wafer 40 and a lid substrate wafer 50, with reference to the flow chart of FIG. 6.

Figure 2:
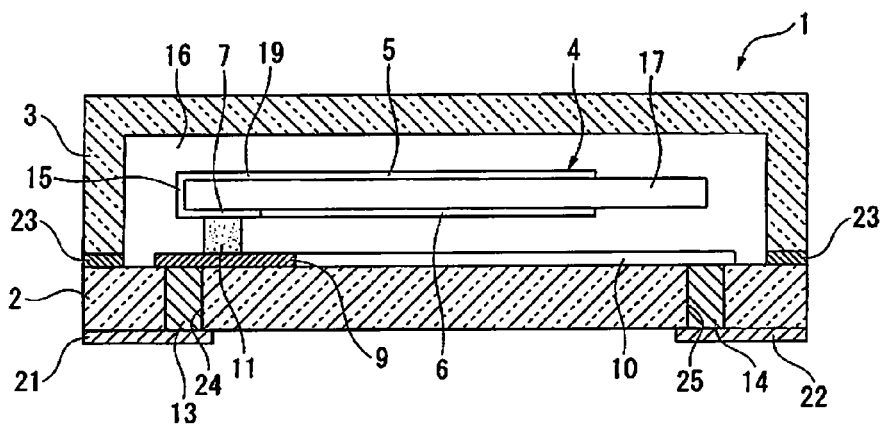
FIG. 2 is a cross sectional view taken along the line A-A of FIG. 1.
Figure 3:
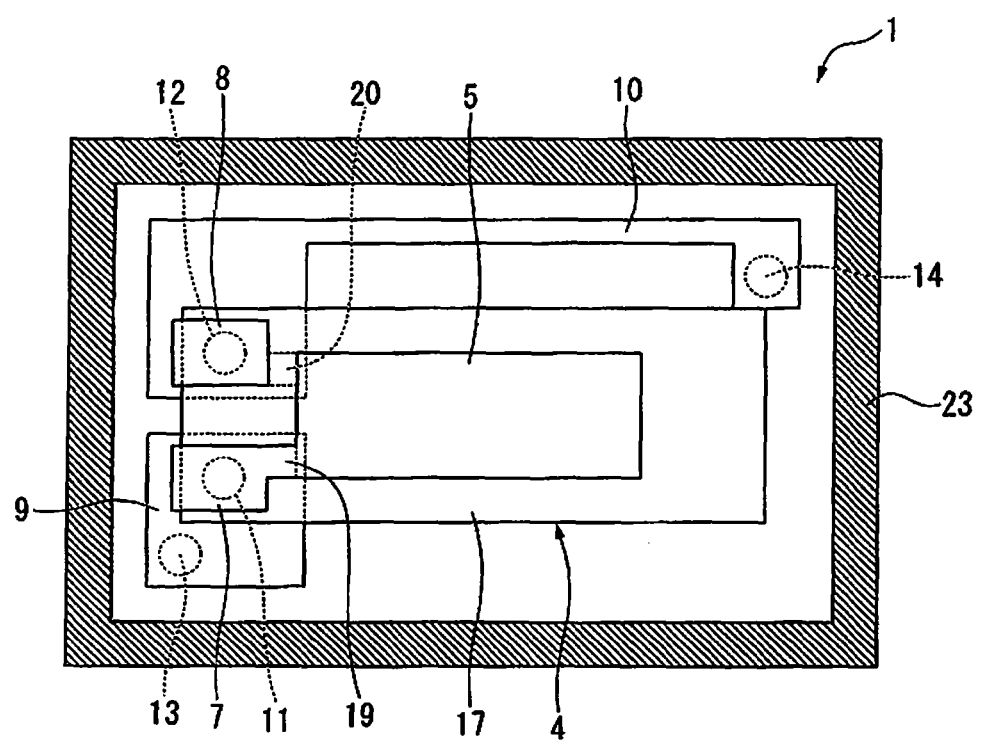
FIG. 3 is an internal schematic diagram of the piezoelectric vibrator illustrated in FIG. 1, showing a piezoelectric vibrating piece without a lid substrate as viewed from above.
Figure 7:
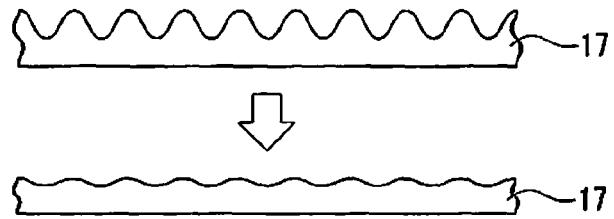
FIG. 7 is an explanatory diagram of one of the manufacturing steps of forming a piezoelectric vibrator along the flow chart of FIG. 6, showing changes in the surface shape of a crystal plate during the light etching of the crystal plate.

First, the piezoelectric vibrating piece 4 illustrated in FIG. 2 to FIG. 4 is fabricated in a piezoelectric vibrating piece fabrication step (S10). Specifically, a crystal of a Lumbered quartz bar is sliced at a predetermined angle to provide a wafer of a constant thickness. The wafer is then coarsely processed by lapping, and mirror finished such as by polishing to obtain a constant thickness. After appropriately processing the wafer by treatment such as washing (S11), the crystal plate 17 is lightly etched (S12). As illustrated in FIG. 7, the light etching is performed by immersing the crystal plate 17 in, for example, a hydrofluoric acid solution to planarize the surface of the crystal plate 17. Then, the underlying film 31 made of chromium is formed in regions of the crystal plate 17 where the mount electrodes 7 and 8 are formed (S13). The underlying film 31 is formed in a thickness of, for example, 0.02 to 0.04 μm. Thereafter, a gold film is deposited and patterned on the crystal plate 17 by photolithography to form the excitation electrodes 5 and 6, the extraction electrodes 19 and 20, the mount electrodes 7 and 8, and the side electrode 15 (S14). Note that the excitation electrodes 5 and 6, the extraction electrodes 19 and 20, the mount electrodes 7 and 8, and the side electrode 15 are formed in a thickness of, for example, 0.1 μm. Then, a gold film is overlaid in regions where the mount electrodes 7 and 8 are formed, using vapor deposition or sputtering (S15). That is, the thickness t1 of the mount electrodes 7 and 8 is increased to about 0.2 μm. This completes the fabrication of a plurality of piezoelectric vibrating pieces 4.

Figure 8:
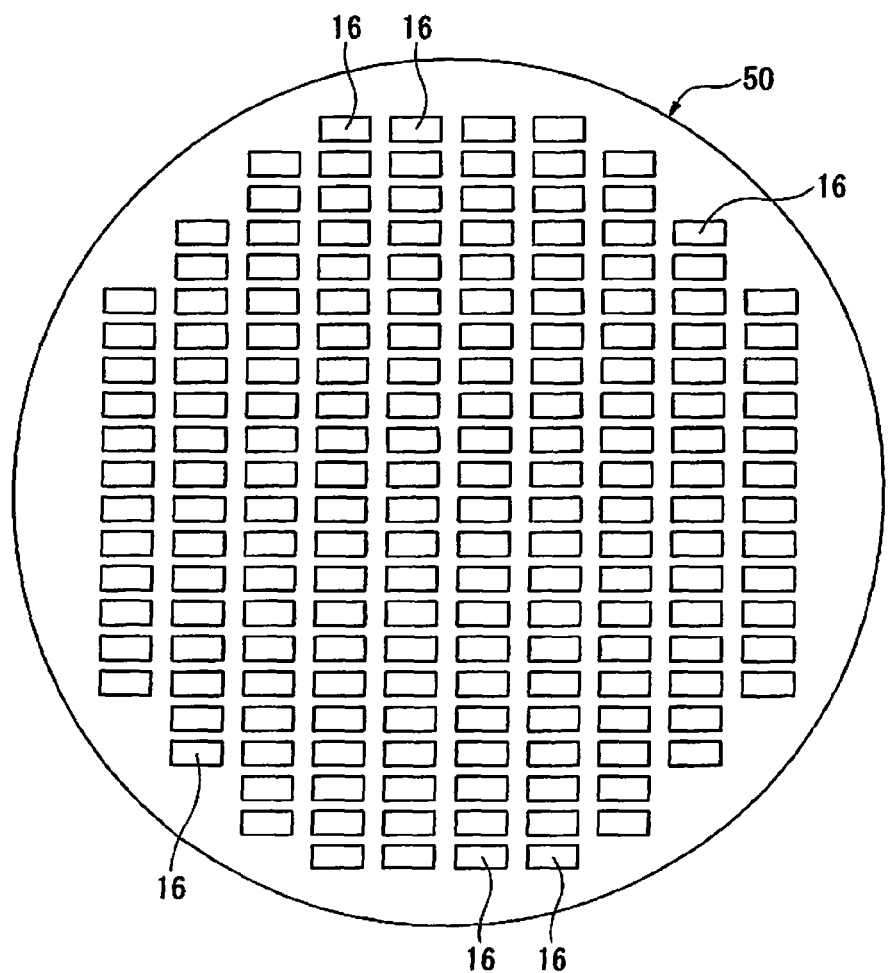
FIG. 8 is an illustration of one of the manufacturing steps of forming a piezoelectric vibrator along the flow chart of FIG. 6, showing a state in which a plurality of depressions is formed in a lid substrate wafer formed into a lid substrate.

Then, a first wafer fabrication step is performed in which the lid substrate wafer 50 to be the lid substrate 3 is fabricated to make it usable for anodic bonding (S20). First, the lid substrate wafer 50, made of soda-lime glass, is polished to a predetermined thickness, and after washing, a disk-shaped lid substrate wafer 50 is formed from which the work-affected layer on the outermost surface has been removed by etching or the like, as illustrated in FIG. 8 (S21). This is followed by a depression forming step in which a plurality of depressions 16 to provide cavities is formed by methods such as etching and embossing in the row and column directions on the bonding face of the lid substrate wafer 50 (S22). After forming the depressions 16, the surface having the depressions 16 is polished in preparation for the bonding step (S60). This completes the first wafer fabrication step.

Concurrently with, or before or after this step, a second wafer fabrication step is performed in which the base substrate wafer 40 to be the base substrate 2 is fabricated to make it usable for anodic bonding (S30). First, soda-lime glass is polished to a predetermined thickness, and after washing, a disk-shaped base substrate wafer 40 is formed from which the work-affected layer on the outermost surface has been removed by etching or the like (S31). This is followed by a through electrodes forming step in which the pairs of through electrodes 13 and 14 are formed in the base substrate wafer 40 (S32).

Figure 9:
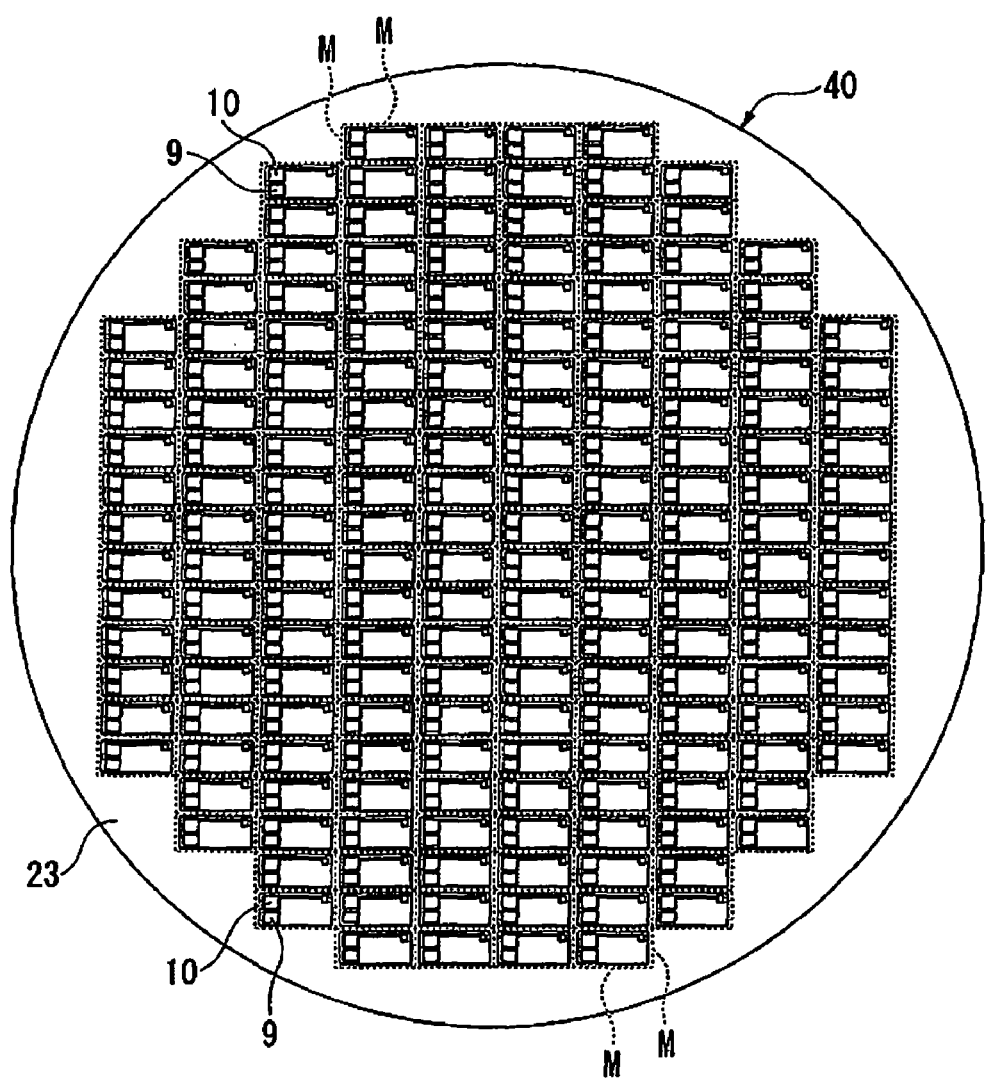
FIG. 9 is an illustration of one of the manufacturing steps of forming a piezoelectric vibrator along the flow chart of FIG. 6, showing a state in which a bonding film and inner electrodes are patterned on the upper surface of a base substrate wafer.
Figure 10:
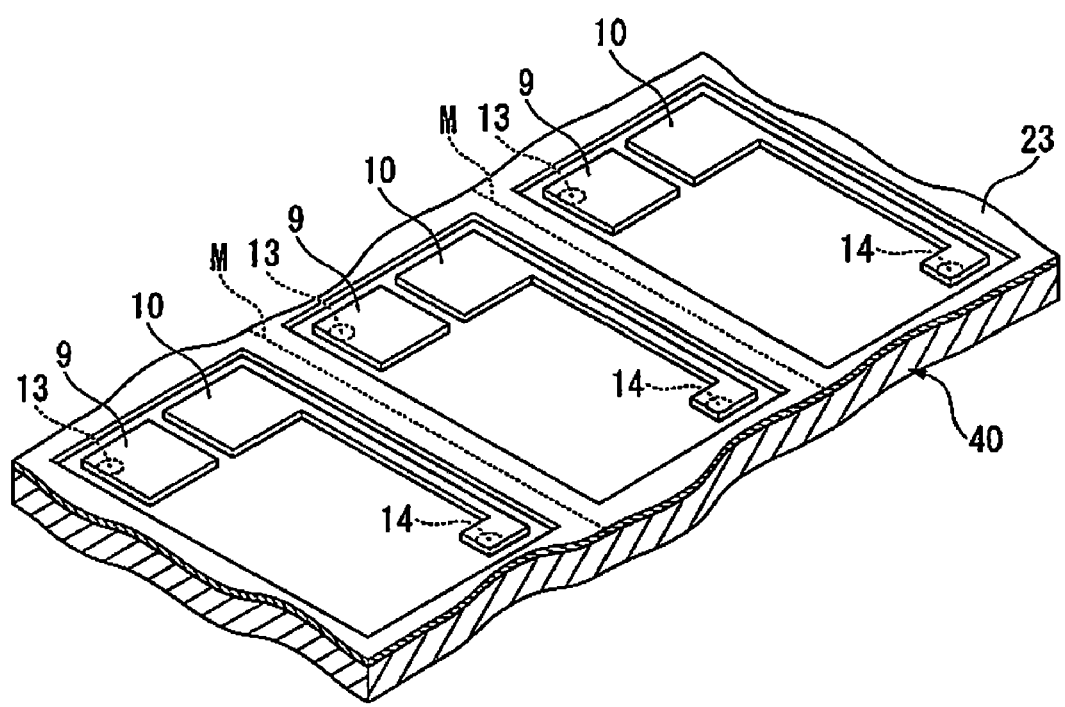
FIG. 10 is a partially enlarged view (perspective view) of FIG. 9.

Next, conductive material is patterned on the upper surface of the base substrate wafer 40 to form the bonding film 23 (bonding film forming step; S33) and the inner electrodes 9 and 10 electrically connected to the through electrodes 13 and 14, respectively (inner electrodes forming step; S34), as illustrated in FIGS. 9 and 10. Note that the dotted lines M shown in FIGS. 9 and 10 are cutting lines used in the subsequent cutting step.

The through electrodes 13 and 14 are substantially flush with the upper surface of the base substrate wafer 40, as described above. Accordingly, the inner electrodes 9 and 10 patterned on the upper surface of the base substrate wafer 40 are closely in contact with the through electrodes 13 and 14 without any gap or space. This ensures conductivity between the one inner electrode 9 and the one through electrode 13, and between the other inner electrode 10 and the other through electrode 14. This completes the second wafer fabrication step.

In FIG. 6, the inner electrodes forming step (S34) is performed after the bonding film forming step (S33); however, the bonding film forming step (S33) may be performed after the inner electrodes forming step (S34), or these steps may be performed simultaneously. The same effect can be obtained regardless of the order of the steps. Accordingly, the order of these steps may be changed appropriately, as needed.

Then, the piezoelectric vibrating pieces 4 fabricated as above are bonded to the upper surface of the base substrate wafer 40 via their respective inner electrodes 9 and 10 (mount step; S40). First, the bumps 11 and 12 are formed on the inner electrodes 9 and 10, respectively, using gold wires.

Then, with the basal portion of the piezoelectric vibrating piece 4 placed on the bumps 11 and 12, the mount electrodes 7 and 8 of the piezoelectric vibrating piece 4 are pressed against the bumps 11 and 12 while heating the bumps 11 and 12 to a predetermined temperature. In this way, the bumps 11 and 12 provide mechanical support for the piezoelectric vibrating piece 4, and the mount electrodes 7 and 8 and the inner electrodes 9 and 10 are electrically connected to each other, respectively.

Here, the piezoelectric vibrating piece 4 is mounted and fixed in such a manner that the tips 11*a* and 12*a* of the bumps 11 and 12 are positioned halfway in the mount electrodes 7 and 8 along the thickness direction. In other words, the piezoelectric vibrating piece 4 is mounted and fixed in such a manner that the tips 11*a* and 12*a* of the bumps 11 and 12 are not in contact with the underlying film 31. Further, the bump bonding of the mount electrode 7 of the crystal plate 17 on the bump 11, and the bump bonding of the mount electrode 8 of the crystal plate 17 on the bump 12 supports the crystal plate 17 substantially parallel to the base substrate 2. As a result, the piezoelectric vibrating piece 4 is supported by being suspended above the base substrate wafer 40. Here, the excitation electrodes 5 and 6 of the piezoelectric vibrating piece 4 conduct to the through electrodes 13 and 14, respectively.

After the piezoelectric vibrating piece 4 is mounted, a mating step is performed in which the lid substrate wafer 50 is mated with the base substrate wafer 40 (S50). Specifically, the wafers 40 and 50 are aligned in position using reference marks or the like (not shown) as a marker. As a result, the piezoelectric vibrating piece 4 mounted as above is housed in the cavity 16 surrounded by the wafers 40 and 50.

After the mating step, the mated two wafers 40 and 50 are placed in an anodic bonding machine (not shown) to perform a bonding step in which the two wafers are anodically bonded together under application of a predetermined voltage in an atmosphere of a predetermined temperature in a vacuum (S60). With the two wafers 40 and 50 set in the anodic bonding machine, a predetermined voltage is applied between the bonding film 23 and the lid substrate wafer 50. This causes an electrochemical reaction at the interface between the bonding film 23 and the lid substrate wafer 50, anodically bonding the two with tight adhesion.

Figure 11:
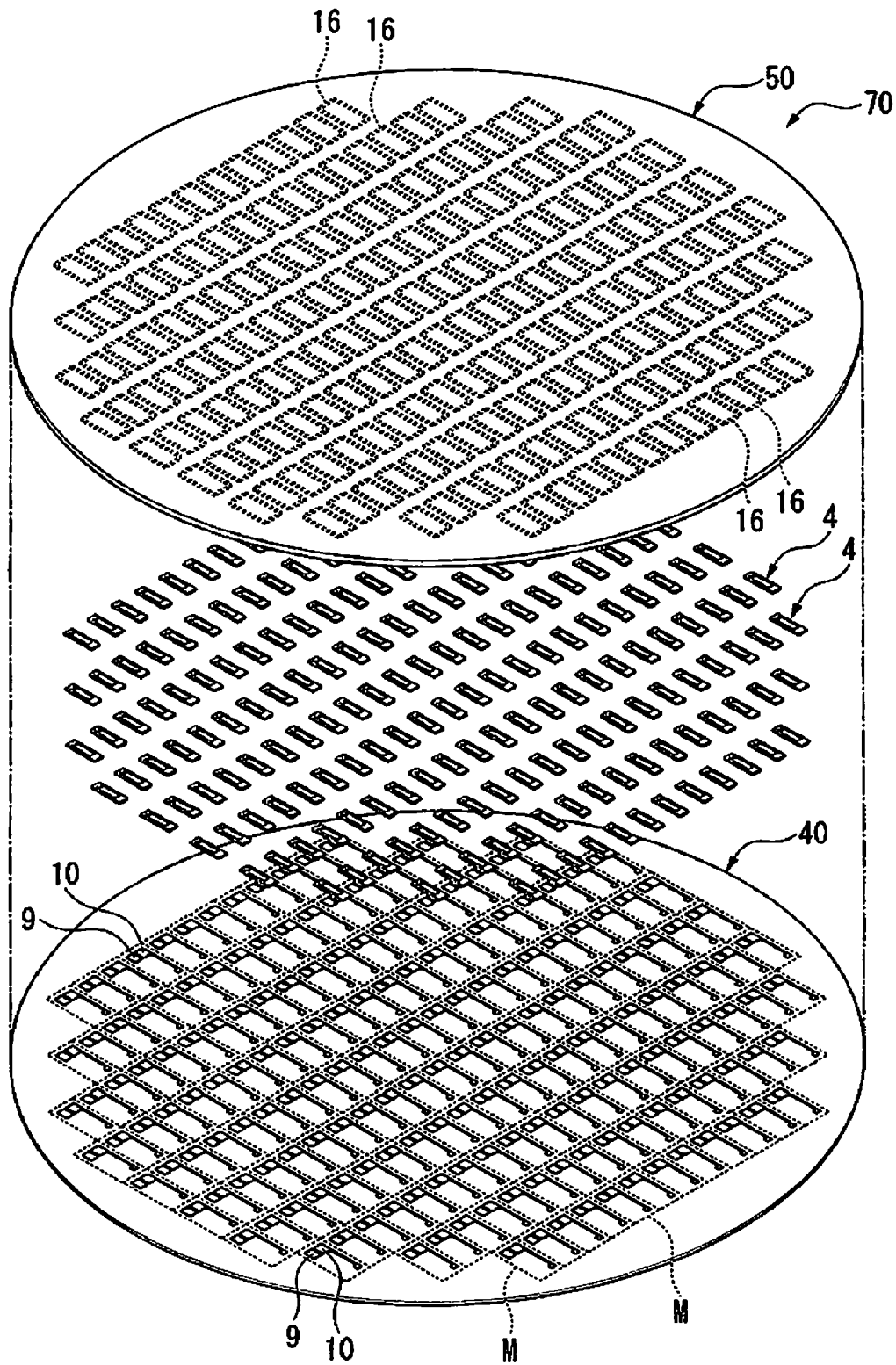
FIG. 11 is an exploded perspective view of one of the manufacturing steps of forming a piezoelectric vibrator along the flow chart of FIG. 6, showing a wafer unit formed by the anodic bonding of a base substrate wafer and a lid substrate wafer with the piezoelectric vibrating piece housed in the cavity.

By the anodic bonding of the two wafers 40 and 50, the piezoelectric vibrating piece 4 is sealed inside the cavity 16 maintained in a vacuum, and a wafer unit 70 in which the base substrate wafer 40 and the lid substrate wafer 50 are bonded together is obtained, as illustrated in FIG. 11. Note that, in FIG. 11, the wafer unit 70 is illustrated in an exploded view, and the bonding film 23 of the base substrate wafer 40 is omitted for ease of illustration. The dotted lines M in FIG. 11 are cutting lines used in the subsequent cutting step.

At the time of anodic bonding, the through holes 24 and 25 formed in the base substrate wafer 40 are completely closed by the through electrodes 13 and 14, and therefore the sealing of the cavity 16 will not be lost through the through holes 24 and 25.

After anodic bonding, an external electrodes forming step is performed in which conductive material is patterned on the lower surface of the base substrate wafer 40 to form the pairs of external electrodes 21 and 22 electrically connected to the pairs of through electrodes 13 and 14, respectively (S70). The external electrodes 21 and 22 formed in this step can then be used to activate the piezoelectric vibrating piece 4 sealed inside the cavity 16.

As in the case of the inner electrodes 9 and 10, because the through electrodes 13 and 14 are substantially flush with the lower surface of the base substrate wafer 40, the external electrodes 21 and 22 patterned in this step are closely in contact with the through electrodes 13 and 14 without any gap or space. This ensures conductivity between the external electrodes 21 and 22 and the through electrodes 13 and 14.

Next, a cutting step is performed in which the wafer unit 70 bonded as above is cut into individual pieces along the cutting lines M shown in FIG. 11 (S80). As a result, a plurality of bilayer, surface-mounted piezoelectric vibrators 1 illustrated in FIG. 1 is manufactured at once, each sealing the piezoelectric vibrating piece 4 in the cavity 16 formed between the anodically bonded base substrate 2 and lid substrate 3.

This is followed by an internal electrical characteristics test (S90). Specifically, measurement is made to check properties of the piezoelectric vibrating piece 4, such as resonant frequency, resonant resistance, and drive level characteristics (excitation power dependence of resonant frequency and resonant resistance). Other properties, such as insulation resistance characteristics are also checked. Then, the piezoelectric vibrator 1 is subjected to an appearance test to check the dimensions, quality, and other conditions of the product. The manufacture of the piezoelectric vibrator 1 is finished upon completion of the checking.

In this embodiment, in the mount step, the piezoelectric vibrating piece 4 is mounted and fixed in such a manner that the tips 11a and 12a of the metal bumps 11 and 12 are not in contact with the underlying film 31. This prevents the possible detachment from the bonding portion that may occur when the tips 11a and 12a of the bumps 11 and 12 are in contact with the crystal plate 17. More specifically, because the piezoelectric vibrating piece 4 is mounted and fixed in such a manner that the tips 11a and 12a of the bumps 11 and 12 are positioned halfway in the mount electrodes 7 and 8, the bond strength between the bumps 11 and 12 and the mount electrodes 7 and 8 can be increased. This ensures the mounting of the piezoelectric vibrating piece 4 by flip-chip bonding.

Further, by the etching step performed before forming the mount electrodes 7 and 8 on the crystal plate 17, the surface irregularities of the crystal plate 17 can be removed. This increases the bonding area for the mount electrodes 7 and 8 subsequently formed on the surface of the crystal plate 17, thereby improving the adhesion between the crystal plate 17 and the mount electrodes 7 and 8.

Further, because the underlying film 31 made of chromium is provided between the crystal plate 17 and the mount electrodes 7 and 8, and because the piezoelectric vibrating piece 4 is mounted and fixed in such a manner that the tips 11a and 12a of the bumps 11 and 12 do not reach the interface between the mount electrodes 7 and 8 and the underlying film 31 in the mount step, the adhesion between the crystal plate 17 and the mount electrodes 7 and 8 can be further improved, and the bond strength between the bumps 11 and 12 and the mount electrodes 7 and 8 can be increased. This ensures the mounting of the piezoelectric vibrating piece 4 by flip-chip bonding.

Further, because the bumps 11 and 12 and the mount electrodes 7 and 8 are both made of gold, the bond strength between the bumps 11 and 12 and the mount electrodes 7 and 8 can be further increased.

When the bumps 11 and 12 are made of gold and the mount electrodes 7 and 8 made of silver, the mount positions where the tips 11a and 12a of the bumps 11 and 12 were fixed in the mount electrodes 7 and 8 can easily be found in the event where the piezoelectric vibrating piece 4 detaches from the bumps 11 and 12, for example. Such defects can be used as feedback to ensure mounting of the piezoelectric vibrating piece 4 by flip-chip bonding.

Oscillator

An embodiment of an oscillator that uses a piezoelectric vibrator according to the present invention is described below with reference to FIG. 12.

Figure 12:
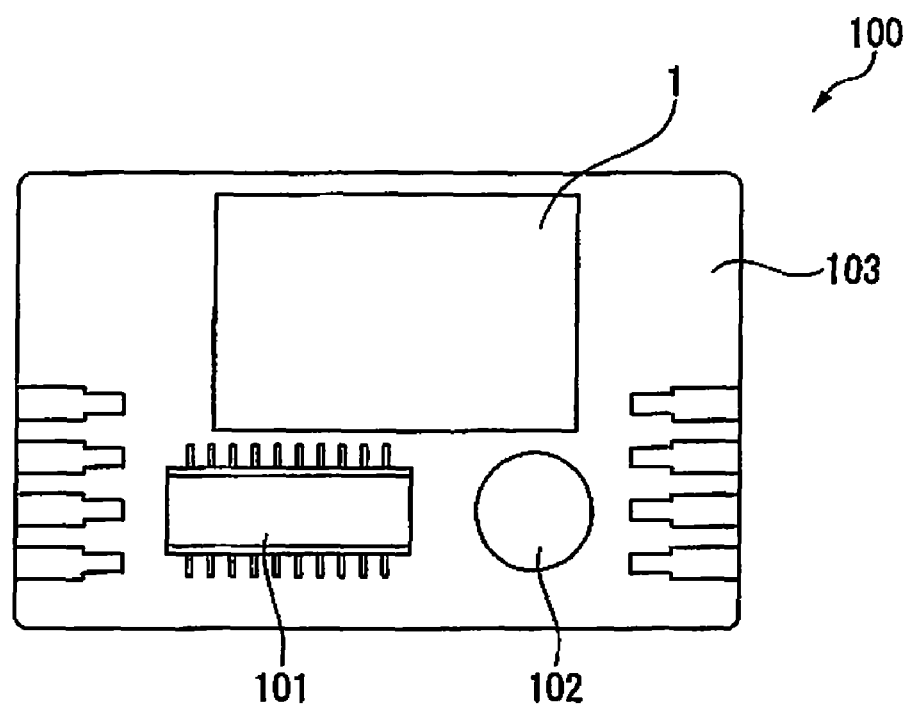
FIG. 12 is a schematic diagram illustrating an oscillator of an embodiment of the present invention.

As illustrated in FIG. 12, an oscillator 100 is structured to include the piezoelectric vibrator 1 provided as a resonator electrically connected to an integrated circuit 101. The oscillator 100 includes a substrate 103 on which electronic components 102 such as capacitors are mounted. The integrated circuit 101 for the oscillator is mounted on the substrate 103, and the piezoelectric vibrator 1 is mounted in the vicinity of the integrated circuit 101. The electronic components 102, the integrated circuit 101, and the piezoelectric vibrator 1 are electrically connected to one another through wiring patterns (not shown). Note that each of these constituting elements is resin molded (not shown).

In the oscillator 100 of this construction, applying a voltage to the piezoelectric vibrator 1 causes the piezoelectric vibrating piece 4 in the piezoelectric vibrator 1 to vibrate. The vibration is transduced into an electrical signal by the piezoelectric characteristics of the piezoelectric vibrating piece 4, and input to the integrated circuit 101 as the electrical signal. The input electrical signal undergoes various processes in the integrated circuit 101, and output as a frequency signal. In this way, the piezoelectric vibrator 1 serves as a resonator.

Further, by configuring the integrated circuit 101 to be selectable according to requirements, for example, such as in an RTC (real-time clock) module, the oscillator can be provided not only as devices such as a single-function oscillator for clocks, but with additional functions, such as the control of operation date and time and the provision of a clock and a calendar, for these and external devices.

As described above, the oscillator 100 of the present embodiment has high quality by virtue of using the piezoelectric vibrator 1 in which the mounting of the piezoelectric vibrating piece 4 is ensured. Further, because the piezoelectric vibrator 1 can be produced with improved yield, the yield of the oscillator 100 is also improved.

It should be noted that the present invention is not limited to the embodiment described above, and various modifications of the embodiment that do not depart from the substance of the present invention are intended to be within the scope of the invention.

For example, the piezoelectric vibrating piece exemplified as using an AT vibrating piece (thickness shear vibrating piece) in the foregoing embodiment may be adapted to use a tuning-fork piezoelectric vibrating piece.

Further, the foregoing described an embodiment in which the depressions are formed in the lid substrate; however, the depressions may be formed in the base substrate, or in the both substrates.

Further, in the foregoing embodiment, the through electrodes are formed in the base substrate to enable voltage application from outside. However, instead of the through electrodes, electrodes may be formed that are routed to outside from the bonded portion of the base substrate and the lid substrate.

Further, the foregoing described an embodiment in which the underlying film is made of chromium; however, the underlying film may be made of conductive material such as aluminum and nickel. That is, materials that can improve the adhesion between the crystal plate and the electrodes made of metal material can be used. Further, the underlying film is not necessarily required, as long as the adhesion between the crystal plate and the electrodes is ensured. When the underlying film is not provided, the piezoelectric vibrating piece is mounted and fixed in such a manner that the tips of the bumps are not in contact with the crystal plate.

What is claimed is:

1. A method for manufacturing a piezoelectric vibrator that comprises:
a base substrate;
a lid substrate bonded to the base substrate, and that forms a cavity between the base substrate and the lid substrate;
a piezoelectric vibrating piece housed in the cavity, and that includes a crystal plate having on its outer surface excitation electrodes and mount electrodes electrically connected to the excitation electrodes,
wherein the mount electrodes comprise a metal film having a greater thickness than the excitation electrodes;
inner electrodes formed on the base substrate to be electrically connected to the piezoelectric vibrating piece; and
metal bumps formed on the inner electrodes to provide electrical interconnections between the inner electrodes and the mount electrodes, and to mount the piezoelectric vibrating piece in a cantilever fashion,
the method comprising:
forming the inner electrodes on the base substrate;
forming the metal bumps on the inner electrodes; and
bonding the mount electrodes of the piezoelectric vibrating piece to the metal bumps, wherein the piezoelectric vibrating piece is mounted and fixed in such a manner that tips of the metal bumps extend into the mount electrodes in a thickness direction but are not in contact with the crystal plate.

2. The method for manufacturing a piezoelectric vibrator according to claim 1, wherein the method further comprises etching the crystal plate prior to forming the mount electrodes on the crystal plate.

3. The method for manufacturing a piezoelectric vibrator according to claim 1,
wherein an underlying film comprising a conductive material is formed in regions of the crystal plate where the mount electrodes are formed, and the mount electrodes are formed after forming the underlying film, and
wherein, upon bonding of the mount electrodes of the piezoelectric vibrating piece to the metal bumps, the piezoelectric vibrating piece is mounted and fixed in such a manner that the tips of the metal bumps are inside the mount electrodes and away from an interface between the mount electrodes and the underlying film.

4. The method for manufacturing a piezoelectric vibrator according to claim 3, wherein the underlying film comprises chromium.

5. The method for manufacturing a piezoelectric vibrator according to claim 1, wherein the metal bumps and the mount electrodes both comprise gold.

6. A piezoelectric vibrator, comprising:
a base substrate;
a lid substrate bonded to the base substrate, and that forms a cavity between the base substrate and the lid substrate;
a piezoelectric vibrating piece housed in the cavity, and that includes a crystal plate having on its outer surface excitation electrodes and mount electrodes electrically connected to the excitation electrodes,
wherein the mount electrodes comprise a metal film having a greater thickness than the excitation electrodes;
inner electrodes formed on the base substrate to be electrically connected to the piezoelectric vibrating piece; and
metal bumps formed on the inner electrodes to provide electrical interconnections between the inner electrodes and the mount electrodes, and to mount the piezoelectric vibrating piece in a cantilever fashion, wherein the metal bumps are mounted and fixed in such a manner that tips of the metal bumps extend into the mount electrodes in a thickness direction but are not in contact with the crystal plate.

7. The piezoelectric vibrator according to claim 6, further comprising an underlying film comprising a conductive material between the crystal plate and the mount electrodes.

8. The piezoelectric vibrator according to claim 7, wherein the underlying film comprises chromium.

9. An oscillator, comprising:
a piezoelectric vibrator of claim 6; and
an integrated circuit electrically connected to the piezoelectric vibrator provided as a resonator.

* * * * *